United States Patent [19]

Sambandan et al.

[11] Patent Number: 5,243,575
[45] Date of Patent: Sep. 7, 1993

[54] ADDRESS TRANSITION DETECTION TO WRITE STATE MACHINE INTERFACE CIRCUIT FOR FLASH MEMORY

[75] Inventors: Sachidanandan Sambandan, Folsom; Peter K. Hazen, Sacramento; Kevin W. Frary, Fair Oaks, all of Calif.

[73] Assignee: Intel Corporation, Santa Clara, Calif.

[21] Appl. No.: 901,266

[22] Filed: Jun. 19, 1992

[51] Int. Cl.$^5$ .............................................. G11C 8/00
[52] U.S. Cl. .................................. 365/233.5; 365/900; 365/189.08
[58] Field of Search ................. 365/233.5, 203, 189.01, 365/189.11, 189.05, 230.01, 900, 189.08

[56] References Cited

U.S. PATENT DOCUMENTS

| | | | |
|---|---|---|---|
| 4,592,028 | 5/1986 | Konishi | 365/233.5 |
| 4,803,665 | 2/1989 | Kasa | 365/223.5 |
| 4,843,596 | 6/1989 | Miyatake et al. | 365/189.08 |
| 4,893,282 | 2/1990 | Wada et al. | 365/189.08 |
| 4,916,668 | 4/1990 | Matsui | 365/230.01 |

Primary Examiner—Eugene R. LaRoche
Assistant Examiner—Vu Le
Attorney, Agent, or Firm—Blakely, Sokoloff, Taylor & Zafman

[57] ABSTRACT

A circuit to ensure that a flash memory device with a write state machine ("WSM") and address transition detection ("ATD") provides correct data after a write/erase step, after an erase suspend command is issued or when the device comes out of deep power-down mode. Whenever the WSM takes control of the device the ATD circuits are disabled. When the WSM relinquishes control over the read path it enables ATD by deasserting the disable ATD bar ("DATDB") signal. An internal signal that is a logical inversion of the chip enable bar ("CEB") input is used along with the DATDB signal to generate ATD pulses. Hence, if the user presents a valid address at the address pins with CEB held deasserted when entering the erase suspend mode, the deassertion of the DATDB by the WSM will generate an ATD pulse and valid data will be presented on output pads of the device after an access time. When the device enters the power-down mode, the ATD content addressable memory ("CAM") is powered-down to system power ("VCC") and all internal addresses are forced high. When the device comes out of the power-down mode, the DATDB signal toggles from high (logical one) to low (logical zero). This ensures that an ATD pulse is generated even if the addresses are not toggled.

31 Claims, 2 Drawing Sheets

ADDRESS TRANSITION DETECTION TO WRITE STATE MACHINE INTERFACE CIRCUIT FOR FLASH MEMORY

FIELD OF THE INVENTION

The present invention relates to method and apparatus for quickly reading flash memory. More specifically, the present invention implements address transition detection in flash memory which has a write state machine.

BACKGROUND OF THE INVENTION

Although it is a relatively new semiconductor technology, flash memory is well known and widely used in the art. Flash memory is nonvolatile, meaning that it retains its contents even if power is removed. This is in contrast to volatile memory technologies like static random access memory ("SRAM") and dynamic random access memory ("DRAM") that require continuous power to store information. Flash memory's cell structure and erasable programmable read-only memory ("EPROM") foundation also insure that it is extremely cost-effective to manufacture, continually scalable to higher densities, and highly reliable. This is a combination of characteristics that other semiconductor memory technologies currently lack.

In contrast to EPROM's, however, which can only be erased through exposure to ultra violet light, the flash memory array is electrically erasable in bulk. This distinguishes it from traditional electrically erasable programmable read-only memory ("EEPROMs") that are by definition byte-alterable. The flash memory erase function empties a part of the device all at once. The device can be programmed (written to) incrementally, however, which is an important capability for applications that require data/file updates.

Flash memory can be read very quickly. However, it takes a significantly longer amount of time to write information into flash memory or to erase the flash memory than it does to read the memory. Part of the reason for this is that, while a location is simply read from flash memory, writing and erasing is an iterative process. Each erase or write operation must be repeated several times and verified to insure that the erasure or write operation has completed successfully. A write state machine ("WSM") which is internal to the flash memory chip permits the flash memory to take control of the write and erase operations thereby unburdening the central processing unit (CPU). Once these operations have completed the write state machine returns control of the flash memory unit to the user. The user may then read, write or erase the chip. The user activates the write state machine by enabling write or erase operations. When neither the write nor erase operations are enabled, the flash memory unit is by default in a read state.

Address transition detection ("ATD") is also well known in the art and has been widely used in SRAM and EPROMs. The purpose of address transition detection circuitry is to increase the speed with which data can be read from memory. This is accomplished by performing operations which are required for every memory read operation as soon as an address transition has been detected.

These operations include equalizing sense amplifiers and latching the previous output. The sense amplifiers are used to increase weak signals sensed from the memory cells to be read during the read operation. Equalizing the sense amplifiers causes the amplifiers to be cleared or otherwise set up so that they are ready to process the new data to be read. Latching the previous output causes the output to stay static until the new data from the read operation has been output from the sense amplifiers. The previous output is latched because the output of the sense amplifiers fluctuates before it finally reaches a steady value. Latching the previous output ensures that the swing does not pass down to the outputs.

Circuitry to equalize the sense amplifiers and latch previous output is well known in the art. In fact, both operations are normally performed during a memory read operation. The address detection circuitry of the present invention simply permits these operations to be performed earlier than would be the case where address transition detection is not employed. However, ATD has not been used with flash memory which employs a write state machine scheme or which has a power-down mode.

SUMMARY AND OBJECTS OF THE INVENTION

One object of the present invention is to provide address transition detection to flash memory which employs a write state machine scheme.

Another object of the present invention is to make the use of address transition detection transparent to a user of the flash memory.

Another object of the present invention is to permit address transistion detection to be disabled in flash memory which uses a write state machine scheme.

Another object of the present invention is to permit address transition detection to work on flash memory which uses a write state machine scheme when the flash memory has a power-down mode.

These and other objects of the present invention are accomplished by an apparatus for address transition detection when reading a memory array.

The memory array comprises a plurality of memory cells. Each of the memory cells has a corresponding unique address which is specified to read the corresponding memory cell. The memory array has a read state in which the memory array can be read and a non-read state in which the memory array cannot be read. Furthermore, the memory array has a chip enable state in which the memory array can be accessed by a user and a chip disable state in which the memory array cannot be accessed by the user.

The apparatus comprises circuitry for providing a chip enable signal, circuitry for providing a read state signal and circuitry for providing an address signal. The apparatus further comprises first and second circuitry for signaling address transition detection.

The chip enable signal indicates when the memory array is in the chip enable state and when the memory array is in the chip disable state. The read state signal indicates when the memory array is in the read state and when the memory array is in the non-read state. The address signal indicates an address of a memory cell of the memory array to be read.

The first circuitry for signaling address transition detection is coupled to the circuitry for providing a read state signal and coupled to the circuitry for providing a chip enable signal. If the memory array is in the non-read state and the chip enable signal indicates that the memory array is in the chip enable state, the first circuitry for signaling address detection outputs an address transition detected signal. Also, if the memory array is in the non-read state and the chip enable signal indicates that the memory array is in the chip disable state, when the chip enable signal changes to indicate that the memory array has entered the chip enable state, the first circuitry for signaling address detection outputs the address transition detected signal.

The second circuitry for signaling address transition detection is coupled to the circuitry for providing a read state signal and coupled to the circuitry for providing an address signal. If the memory array is in the read state and the address signal changes from a first address to a second address, the second circuitry for signaling address detection outputs the address transition detected signal.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

An apparatus and method is disclosed for implementing address transition detection in flash memory which employs a write state machine scheme.

Figure 1:
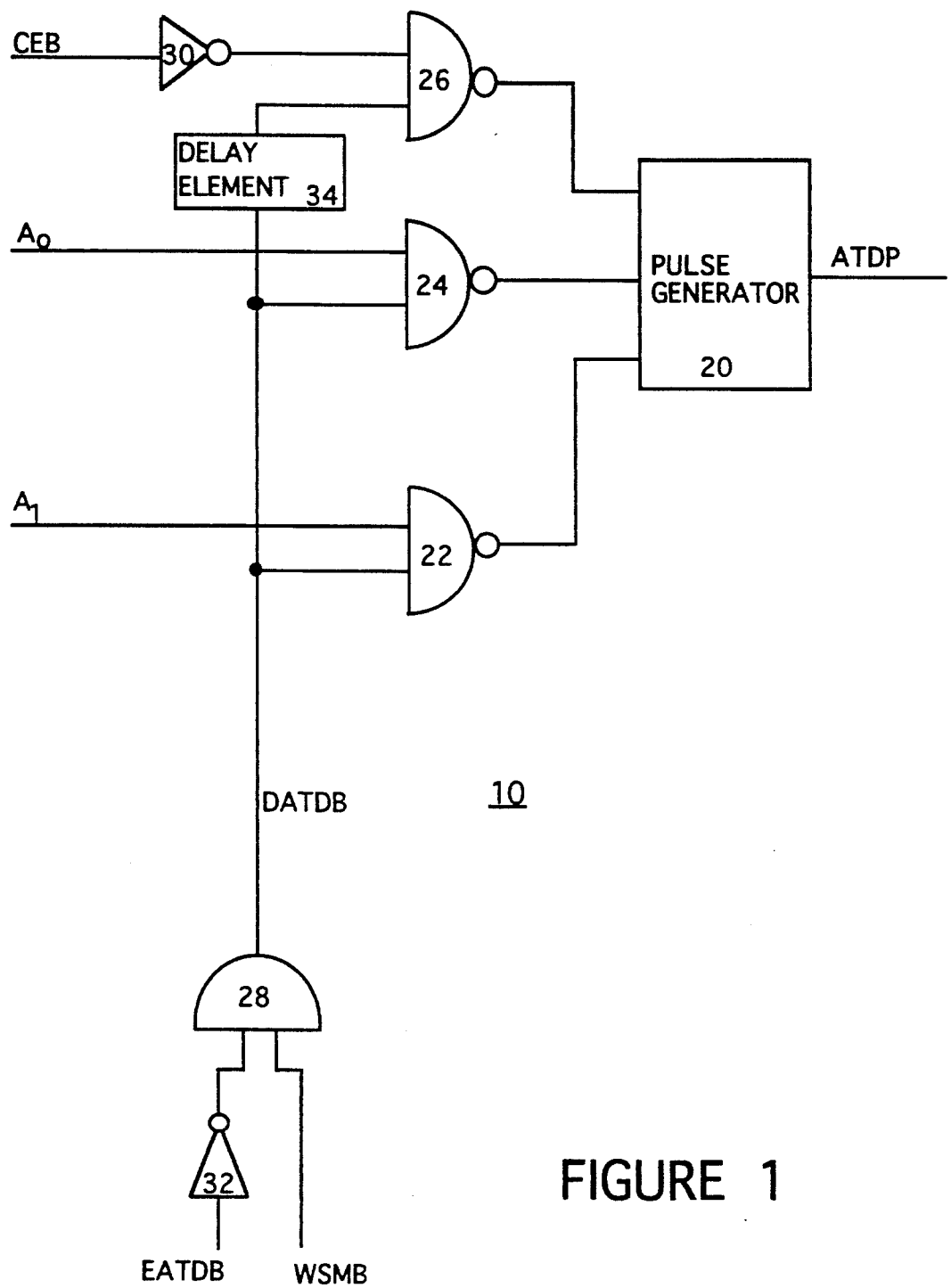
FIG. 1 illustrates address transition detection to write state machine interface circuitry.

FIG. 1 depicts address transition detection ("ATD") to write state machine ("WSM") interface circuitry 10 for a flash memory device. The output of interface circuitry 10 is signal address transition detection pulse ("ATDP") which is generated by pulse generator 20. A pulse on signal ATDP causes the sense amplifiers (not shown) to be equalized and previous output to be latched.

Pulse generator 20 is coupled to NAND gates 22-26. A pulse on signal ATDP is generated by pulse generator 20 whenever a signal from NAND gates 22-26 transitions from high (logical one) to low (logical zero) or vice versa. NAND gates 22-26 are a type of circuitry well known in the art. Each NAND gate 22-26 has two inputs and a single output. The output of a NAND gate is high (logical one) so long as both inputs to the NAND gate are not high. If both inputs to the NAND gate are high (logical one), then the output of the NAND gate will be low (logical zero). Signal disable address transition detection bar ("DATDB") is output from AND gate 28 and is input to NAND gates 22-24. Signal DATDB is also input to delay element 34. The output of delay element 34 is input to NAND gate 26.

When signal DATDB is low (logical zero), address transition detection is to be disabled. Alternately, when signal DATDB is high (logical one) address transition detection is enabled.

Address signals A1 and A0 are input into NAND gates 22 and 24, respectively. Together, address signals A0 and A1 form a two-bit address, with A0 being the least significant bit of the address and A1 being the most significant bit of the address. A two bit address scheme has been presented in FIG. 1 to simplify the circuitry for ease of presentation. In the preferred embodiment, the address is comprised of at least eighteen bits, each of which is input into a separate NAND gate, in a manner which is easily extendible by one skilled in the art.

An address to be read from the flash memory is input over signal lines A0 and A1. Whenever a new address is requested by the user, either A0 or A1 (or both A0 and A1), must change value from zero to one or from one to zero. Whenever address transition detection is enabled (signal DATDB is equal to logical one), an address transition which causes A0 or A1 to change will cause the output of NAND gates 24 or 22 respectively to change from the value one to the value zero or vice versa. This in turn will cause pulse generator 20 to generate a pulse signal ATDP. This concept is best demonstrated by example.

If address zero had been detected previously, and the user desired to read address decimal two (which is equal to binary 10), signal A0 would remain zero but signal A1 would transition from a zero value to a one value. If signal DATDB had a value of one, indicating that address transition detection was enabled, the input to NAND gate 24 would not change. In this case, A0 would equal zero and DATDB would equal one so NAND gate 24 would continue to output the value one to the pulse generator 20.

On the other hand, the output of NAND gate 22 would change from a one to a zero thereby causing pulse generator 20 to generate pulse signal ATDP. The input to NAND gate 22 would change because, while signal DATDB remained one, signal A1 would change from zero to one as the address changed from zero to decimal two.

Whenever signal DATDB has a value of zero, indicating that address transition detection is disabled, any changes in address signals A0 or A1 will not cause pulse generator 20 to generate pulse signal ATDP. This is because, as long as signal DATDB has value zero, the output of NAND gates 22-24 must be one. However, as soon as signal DATDB changes from zero to one, indicating that address transition detection has been enabled, pulse signal ATDP will be generated by pulse generator 20 if any bit of the address (A0 or A1 in this case) has a value of logical one. Therefore, an address transition which occurs while address transition detection has been disabled will cause ATDP to be generated as soon as address transition detection has been enabled.

Note however that there is one address transition which will not cause NAND gates 22 or 24 to generate a low signal required by pulse generator 20 to cause signal ATDP to be generated. This occurs whenever there is a transition to address zero while address transition detection has been disabled (i.e. DATDB is zero). When the address to be read is address zero, all address signal lines (in this case A0 and A1) will have the value zero. Every NAND gate (NAND gates 22-24) corresponding to an address signal line (A0 and A1) will have an input of zero from the address signal line and therefore must have an output of one regardless of whether DATDB has a value of zero or one.

To handle this anomalous case, signal chip enable bar ("CEB") is input into inverter 30. Then the output of inverter 30 is input along with signal DATDB (delayed by delay element 34) to NAND gate 26. The output of NAND gate 26 is input to pulse generator 20 along with the outputs of NAND gates 22-24.

Signal CEB has a value of zero when the user has enabled the flash memory chip. When signal CEB has a value of one, the flash memory chip has been disabled by the user. Inverter 30 has as output a value of one when its input is value zero and an output value of zero when its input has a value of one. Therefore, the signal output from inverter 30 (and input to NAND gate 26) will have a value of one when the chip is enabled and a value of zero when the chip has been disabled.

A user can only read memory from a flash memory cell whenever the chip containing the flash memory is enabled. When the chip is not enabled, the output buffers of the chip are tri-stated and thus do not provide any information which can be read. Therefore, whenever the chip is enabled and signal DATDB transitions from a zero to a one (indicating that address transition detection has been enabled), the output of NAND gate 26 will change from a one to a zero thereby causing pulse generator 20 to generate signal ATDP. This signal will occur whenever the chip is enabled, and address transition detection is changed from being disabled to being enabled, regardless of the address presented on the address signal lines (including the anomalous address zero).

If, however, the chip is disabled when address transition detection changes from being disabled to enabled, and there has been a transition to address zero when address transition detection was disabled, NAND gates 22-26 will each have a zero value as one of their inputs and hence no pulse signal ATDP will be generated by pulse generator 20. However, because the chip is not enabled, the user is unable to read data from the chip. As soon as the user enables the chip, signal CEB will transition from value one to value zero thereby causing a transition of the output signal of inverter 30 to go from a zero value to a one value. Because address transition detection has been enabled, NAND gate 26 will also have as input signal DATDB with a value of one. Therefore, NAND gate 26 will have a transition in its output from one to zero thereby causing pulse generator 20 to generate a signal pulse ATDP. This pulse will be generated even though there was a transition to address zero.

Signal enable address transition detection bar ("EATDB") is input to inverter 32. The output of inverter 32 and signal write state machine bar ("WSMB") are input to AND gate 28 whose output is signal DATDB. Signal WSMB is generated by the write state machine and has a value low (logical zero) when the write state machine has control of the flash memory chip to perform a write or erase operation. Signal WSMB has a value which is high (logical one) when the write state machine has relinquished control of the chip so that the user may read from the flash memory.

In the preferred embodiment of the present invention it is possible to configure a flash memory cell so that address transition detection will not be available on the chip. Signal EATDB indicates whether or not the flash memory chip has been configured to permit address transition detection. When signal EATDB has a value which is low (logical zero) the flash memory has been configured to permit address transition detection. Conversely, when signal EATDB has a value which is high (logical one) the flash memory chip has been configured to not have addressed transition detection.

AND gate 28 is a type of logic circuit well known in the art. AND gate 28 will have as output a high signal (logical one) whenever the inputs to AND gate 28 are both high (i.e. signal EATDB low and WSMB high). The output of AND gate 28 will be low whenever either, or both, of the inputs to AND gate 28 are not high.

As discussed earlier, the output from AND gate 28 is signal DATDB. Whenever the flash memory chip has been configured to permit address transition detection, signal EATDB will be zero. This will cause a one to be input to AND gate 28 from inverter 32. Therefore, signal DATDB will have whatever value signal WSMB has. Thus, so long as signal EATDB is zero, when signal WSMB has a low value, indicating that the write state machine has control of the flash memory chip, signal DATDB will have a low value which indicates that the address transition detection circuitry is disabled. As mentioned previously, because NAND gates 22-26 will have a low value input from signal DATDB, pulse generator 20 will not generate pulse signal ATDP.

Conversely, when signal EATDB is low, indicating that the flash memory chip has been configured to permit address transition detection, and signal WSMB is high, indicating that the write state machine does not have control over the flash memory chip, signal DATDB will be high, indicating that the address transition detection is enabled. As discussed previously, this will permit NAND gates 22-26 to have an output transition from high to low when the nonDATDB input transitions from low to high. Therefore, pulses will be generated as address transition detections are made.

When signal EATDB is high, indicating that address transition detection configuration is not available for the flash memory chip, signal DATDB will always be low indicating that ATD is not available.

Figure 2:
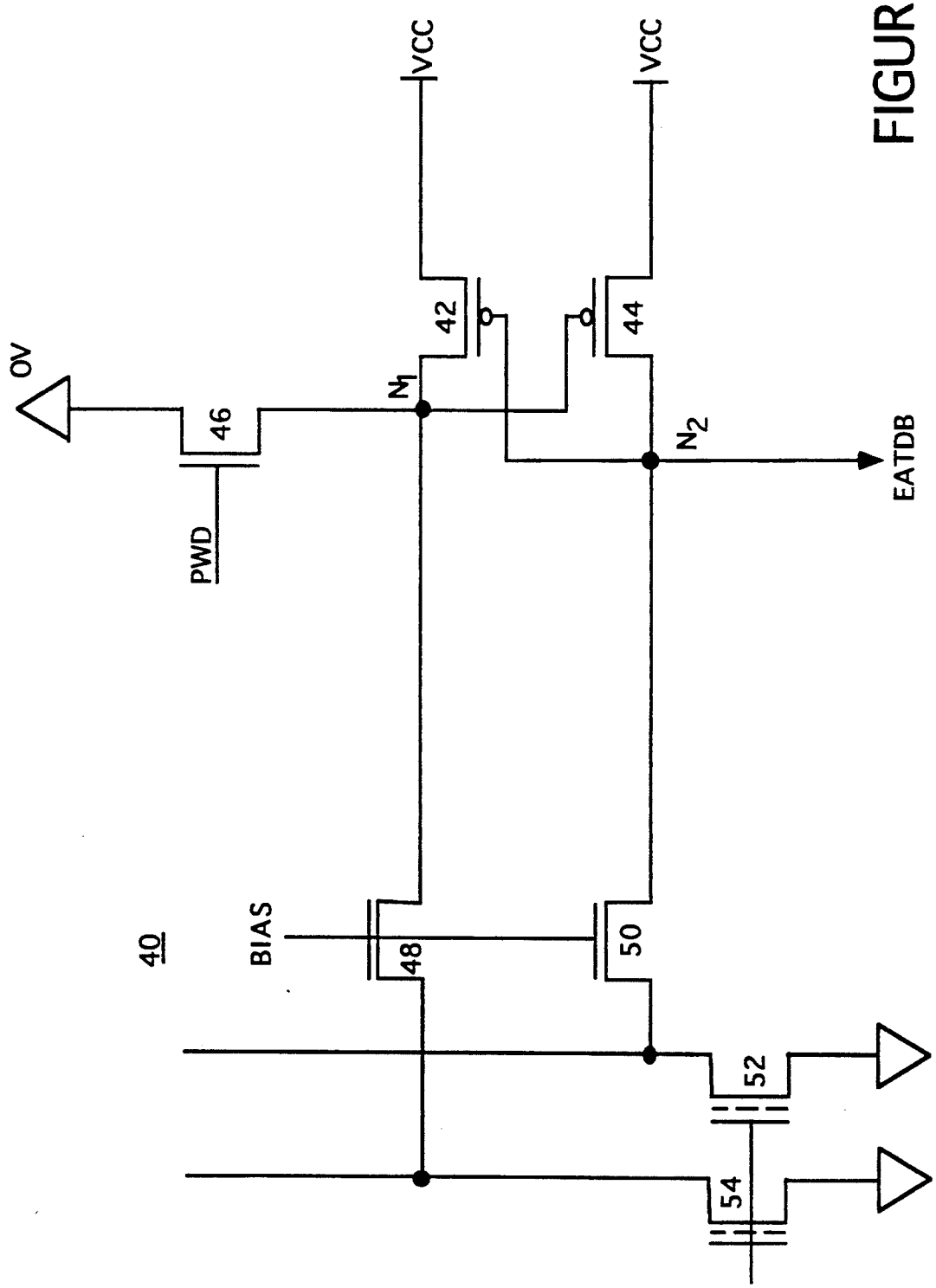
FIG. 2 illustrates content addressable memory circuitry to disable the address transition detection mode of the present invention.

FIG. 2 is a content addressable memory ("CAM") cell 40 which has as output signal EATDB. CAM cells are well known in the art and widely used. A CAM cell is often used to store a logical one or logical zero value to indicate a particular configuration of a device. Usually, CAM cells used in this way are configured such that the value which they store cannot be modified by the user. In the present invention, CAM cell 40 stores a logical one value if the flash memory chip has been configured with address transition detection mode disabled. On the other hand, if the flash memory chip has been configured with address transition detection mode enabled, CAM cell 40 stores a logical zero value.

CAM cells are usually designed to have an output value of zero when the flash memory chip has been placed in an energy saving power-down mode (i.e. deep sleep). However, CAM cell 40 has been modified to power-down to an output of logical one when the flash memory circuit is placed in power-down mode. This has been done to prevent an error from occurring when the chip is configured to permit address transition detection.

Referring again to FIG. 1, if signal EATDB had gone to zero at power-down, as is the usual practice in the art, and if the flash memory was configured with address detection enabled, then EATDB would have a value of zero during power-down and after power-down ceased. In that event, if there had been an address transition to address zero when the chip was enabled, but in power-down mode, and when the write state machine did not have control of the chip, there would be no pulse from signal ATDP generated by pulse generator 20 when the flash memory chip returned from power-down mode. Therefore address transition detection would fail resulting in improper data being read from the flash memory.

The solution is to ensure signal EATDB has the value logical one at power-down. Then, if the CAM cell has been set to zero to indicate configuration for address transition detection, the signal EATDB will transition from one to zero when power-down ceases. The transition of signal EATDB from one to zero on power up will cause signal DATDB to transition from zero to one (if signal WSMB has a value one indicating that the write state machine does not have control of the part). Because the chip is enabled, signal CEB will be low which means that the output from inverter 30 will be high. Therefore, NAND gate 26 will have two high signals input and will output a low signal causing pulse generator 20 to generate a pulse for signal ATDP.

Since a pulse is generated out of NAND 26 when coming out of power-down, delay element 34 is inserted between the DATDB signal and NAND 26. This is necessary because in deep power-down mode, most circuits are disabled, including the sense amplifiers. If an ATD pulse is generated before the sense amplifiers are turned on, correct data will not be latched in the sense amplifier. Inserting the delay, ensures that the necessary circuits are ready when the ATD pulse is generated.

Delay element 32 is a type of circuit well known in the art. A common way to form a delay element is to couple an even number of inverters in series.

Referring again to FIG. 2, CAM cell 40 is comprised of seven metal-oxide semiconductor ("MOS") devices of kinds which are well known in the art. MOS devices 42–44 are P type devices. MOS devices 46–50 are N type devices. MOS devices 52 are flash memory cells. Signal BIAS provides a bias voltage to devices 48 and 50, which hold the drains of flash memory devices 54 and 52, respectively, at a constant voltage.

When the flash memory chip enters power-down mode, signal BIAS is drawn to system ground (VSS=0V). At power-down, signal PWD is input to device 46 causing node N1 to be pulled to ground. That causes device 44 to pull node N2 to system power (VCC). Therefore device 42 is shut off, and signal EATDB becomes logical one (VCC) during power-down.

Thus, the present invention implements an address transition detection scheme in a flash memory integrated circuit which uses a write state machine. As such, the present invention increases the speed at which the flash memory can be read while ensuring that all address transitions are properly detected so that the proper data is read from the flash memory cell.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for address transition detection when reading a memory array, said memory array comprised of a plurality of memory cells, each of said memory cells having a corresponding unique address which is specified to read corresponding said memory cell, said memory array having a read state in which said memory array can be read and a non-read state in which said memory array cannot be read, said memory array having a chip enable state in which said memory array can be accessed by a user and a chip disable state in which said memory array cannot be accessed by said user, said apparatus comprising:

circuitry for providing a chip enable signal, said chip enable signal indicating when said memory array is in said chip enable state and when said memory array is in said chip disable state;

circuitry for providing a read state signal, said read state signal indicating when said memory array is in said read state and when said memory array is in said non-read state;

first circuitry for signaling address transition detection, coupled to said circuitry for providing a read state signal and coupled to said circuitry for providing a chip enable signal such that if said memory array is in said non-read state and said chip enable signal indicates that said memory array is in said chip enable state, said first circuitry for signaling address detection outputs an address transition detected signal, and if said memory array is in said non-read state and said chip enable signal indicates that said memory array is in said chip disable state, when said chip enable signal changes to indicate that said memory array has entered said chip enable state, said first circuitry for signaling address detection outputs said address transition detected signal;

circuitry for providing an address signal, said address signal indicating an address of a memory cell of said memory array to be read; and second circuitry for signaling address transition detection, coupled to said circuitry for providing a read state signal and coupled to said circuitry for providing an address signal such that if said memory array is in said read state and said address signal changes from a first address to a second address, said second circuitry for signaling address detection outputs said address transition detected signal.

2. The apparatus for address transition detection as set forth in claim 1 wherein said read state signal is a single bit signal which has a value of logical one when said memory array is in said read state and has a value of logical zero when said memory array is in said non-read state;

said chip enable signal is a single bit signal which has a value of logical one when said memory array is in said chip enable state and has a value of logical zero when said memory array is in said chip disable state; and said first circuitry for signaling address transition detection is a nand gate having said read state signal and said chip enable signal as inputs and having as output said address transition detected signal.

3. The apparatus for address transition detection as set forth in claim 2 wherein said address signal is a multiple bit signal comprised of a plurality of address bit signals, each said address bit signal having a value of logical one or logical zero and corresponding to a unique bit of a binary address;

said second circuitry for signaling address transition detection is comprised of a plurality of nand gates equal in number to said number of address bit signals, each of said nand gates corresponding to a different one of said address bit signals and having as input said one of said address bit signals and said read state signal and having as output said address detected signal.

4. The apparatus for address transition detection as set forth in claim 1 wherein said address transition detection can be enabled such that address transition detected signals are output or can be disabled such that no address transition detected signals are output.

5. The apparatus for address transition detection as set forth in claim 4 further comprising:
   circuitry for providing an address transition detection configuration signal, said address transition detection configuration signal indicating when said apparatus for address transition detection has been configured such that said address transition detection is disabled and when said apparatus for address transition detection has been configured such that said address transition detection is enabled;
   an address transition detection disablement circuitry for disabling address transition detection coupled between said circuitry for providing a disable address transition signal and said first and second circuitry for signaling address transition detection, said address transition detection disablement circuitry having as input said read state signal and said address transition detection configuration signal, if said address transition detection configuration signal indicates said apparatus for address transition detection has been configured such that said address transition detection is enabled, said address transition detection disablement circuitry having as output an address transition detection signal and if said address transition detection configuration signal indicates said apparatus for address transition detection has been configured such that said address transition detection is disabled, said address transition detection disablement circuitry not outputting said address transition detection signal.

6. The apparatus for address transition detection as set forth in claim 5 wherein
   said address transition detection disablement circuitry is an AND gate;
   said read state signal is a single bit signal having a value of logical one when said memory array is in said read state and a value of logical zero when said memory array is in said non-read state; and
   said address transition detection configuration signal is a single bit signal which has a value of logical one when said apparatus for address transition detection has been configured such that said address transition detection is enabled and has a value of logical zero when said apparatus for address transition detection has been configured such that said address transition detection is disabled.

7. The apparatus for address transition detection as set forth in claim 6 wherein said circuitry for providing an address transition detection configuration signal is a content addressable memory cell.

8. The apparatus for address transition detection as set forth in claim 7 wherein said content addressable memory cell is comprised of flash memory cells which retain information regarding whether or not said memory array is configured for address transition detection.

9. The apparatus for address transition detection as set forth in claim 8 further comprising a signal inversion circuitry, coupled between said address transition detection disablement circuitry and said content addressable memory cell, said signal inversion circuitry for inverting signals such that said signal inversion circuitry has an output of logical one when logical zero is input, and said signal inversion circuitry has an output of logical zero when logical one is input, and wherein said memory array has a power-down mode and said content addressable memory cell has an output of logical one when said memory array is in said power-down mode.

10. The apparatus for address transition detection as set forth in claim 9 further comprising a delay element circuitry, coupled between said address transition detection disablement circuitry and said first circuitry for signaling address transition detection, said delay element circuitry for delaying said address transition detection signal.

11. The apparatus for address transition detection as set forth in claim 1 wherein said memory array is comprised of flash memory cells.

12. The apparatus for address transition detection as set forth in claim 1 wherein said non-read state occurs when a write state machine is active.

13. The apparatus for address transition detection as set forth in claim 12 wherein said write state machine is active when said memory array is being programmed or erased.

14. A method for address transition detection when reading a memory array, said memory array comprised of a plurality of memory cells, each of said memory cells having a corresponding unique address which is specified to read corresponding said memory cell, said memory array having a read state in which said memory array can be read and non-read state in which said memory array cannot be read, said memory array having a chip enable state in which said memory array can be accessed by a user and a chip disable state in which said memory array cannot be accessed by said user, said method comprising the steps of:
   (a) providing a chip enable signal to a first circuitry for signaling address transition detection, said chip enable signal indicating when said memory array is in said chip enable state and when said memory array is in said chip disable state;
   (b) providing a read state signal to said first circuitry for signaling address transition detection, said read state signal indicating when said memory array is in said read state and when said memory array is in said non-read state;
   (c) if said memory array is in said non-read state and said chip enable signal indicates that said memory array is in said chip enable state, said first circuitry for signaling address detection outputting an address transition detected signal;
   (d) if said memory array is in said non-read state and said chip enable signal indicates that said memory array is in said chip disable state, when said chip enable signal changes to indicate that said memory array has entered said chip enable state, said first circuitry for signaling address detection outputting said address transition detected signal;
   (e) providing an address signal to a second circuitry for signaling address transition detection, said address signal indicating an address of a memory cell of said memory array to be read; and
   (f) providing said read state signal to said second circuitry for signaling address transition detection;
   (g) if said memory array is in said read state and said address signal changes from a first address to a second address, said second circuitry for signaling address detection outputting said address transition detected signal.

15. The method for address transition detection as set forth in claim 14 wherein said read state signal is a single bit signal which has a value of logical one when said memory array is in said read state and has a value of logical zero when said memory array is in said non-read state;

said chip enable signal is a single bit signal which has a value of logical one when said memory array is in said chip enable state and has a value of logical zero when said memory array is in said chip disable state; and said first circuitry for signaling address transition detection is a nand gate having said read state signal and said chip enable signal as inputs and having as output said address transition detected signal.

16. The method for address transition detection as set forth in claim 15 wherein said address signal is a multiple bit signal comprised of a plurality of address bit signals, each said address bit signal having a value of logical one or logical zero and corresponding to a unique bit of a binary address;

said second circuitry for signaling address transition detection is comprised of a plurality of nand gates equal in number to said number of address bit signals, each of said nand gates corresponding to a different one of said address bit signals and having as input said one of said address bit signals and said read state signal and having as output said address detected signal.

17. The method for address transition detection as set forth in claim 14 wherein said address transition detection can be enabled such that address transition detected signals are output or can be disabled such that no address transition detected signals are output.

18. The method for address transition detection as set forth in claim 14 wherein said memory array is comprised of flash memory cells.

19. The method for address transition detection as set forth in claim 14 wherein said non-read state occurs when a write state machine is active.

20. The method for address transition detection as set forth in claim 19 wherein said write state machine is active when said memory array is being programmed or erased.

21. A method for address transition detection when reading a memory array, said memory array comprised of a plurality of memory cells, each of said memory cells having a corresponding unique address which is specified to read corresponding said memory cell, said memory array having a read state in which said memory array can be read and a non-read state in which said memory array cannot be read, said memory array having a chip enable state in which said memory array can be accessed by a user and a chip disable state in which said memory array cannot be accessed by said user, said method comprising the steps of:

(a) providing an address transition detection configuration signal to an address transition detection disablement circuitry for disabling address transition detection, said address transition detection configuration signal indicating when said address transition detection is disabled and when said address transition detection is enabled;

(b) providing a read state signal to said first circuitry for signaling address transition detection, said read state signal indicating when said memory array is in said read state and when said memory array is in said non-read state;

(c) if said address transition detection configuration signal indicates said address transition detection is enabled, said address transition detection disablement circuitry outputting said read state signal to a first and a second circuitry for signaling address transition detection;

(d) if said address transition detection configuration signal indicates said address transition detection is disabled, said address transition detection disablement circuitry blocking output of said read state signal to said first and second circuitry for signaling address transition detection;

(e) providing a chip enable signal to said first circuitry for signaling address transition detection, said chip enable signal indicating when said memory array is in said chip enable state and when said memory array is in said chip disable state;

(f) if said read state signal is output to said first circuitry for signaling address transition detection, said read state signal indicates said memory array is in said non-read state and said chip enable signal indicates that said memory array is in said chip enable state, said first circuitry for signaling address detection outputting an address transition detected signal;

(g) if said read state signal is output to said first circuitry for signaling address transition detection, said read state signal indicates said memory array is in said non-read state and said chip enable signal indicates that said memory array is in said chip disable state, when said chip enable signal changes to indicate that said memory array has entered said chip enable state, said first circuitry for signaling address detection outputting said address transition detected signal;

(h) providing an address signal to said second circuitry for signaling address transition detection, said address signal indicating an address of a memory cell of said memory array to be read; and (i) if said read state signal is output to said second circuitry for signaling address transition detection, said read state signal indicates said memory array is in said read state and said address signal changes from a first address to a second address, said second circuitry for signaling address detection outputting said address transition detected signal.

22. The method for address transition detection as set forth in claim 21 wherein said address transition detection disablement circuitry is an AND gate;

said read state signal is a single bit signal having a value of logical one when said memory array is in said read state and a value of logical zero when said memory array is in said non-read state; and said address transition detection configuration signal is a single bit signal which has a value of logical one when said address transition detection is enabled and has a value of logical zero when said address transition detection is disabled.

23. The method for address transition detection as set forth in claim 22 wherein said chip enable signal is a single bit signal which has a value of logical one when said memory array is in said chip enable state and has a value of logical zero when said memory array is in said chip disable state; and said first circuitry for signaling address transition detection is a nand gate having said read state signal and said chip enable signal as inputs and having as output said address transition detected signal.

24. The method for address transition detection as set forth in claim 23 wherein said address signal is a multiple bit signal comprised of a plurality of address bit signals, each said address bit signal having a value of logical one or logical zero and corresponding to a unique bit of a binary address;

said second circuitry for signaling address transition detection is comprised of a plurality of nand gates equal in number to said number of address bit signals, each of said nand gates corresponding to a different one of said address bit signals and having as input said one of said address bit signals and said read state signal and having as output said address detected signal.

25. The method for address transition detection as set forth in claim 21 wherein said address transition detection configuration signal is provided by a content addressable memory cell.

26. The method for address transition detection as set forth in claim 25 wherein said content addressable memory cell is comprised of flash memory cells which retain information regarding whether said address transition detection is enabled or disabled.

27. The method for address transition detection as set forth in claim 26 wherein said memory array has a power-down mode and said content addressable memory cell has an output of logical one when said memory array is in said power-down mode, said method further comprising the step of:

inverting said output of said content addressable memory to form said address transition detection configuration signal.

28. The method for address transition detection as set forth in claim 27 further comprising the step of:

delaying said read state signal to said first circuitry for signaling address transition detection.

29. The method for address transition detection as set forth in claim 21 wherein said memory array is comprised of flash memory cells.

30. The method for address transition detection as set forth in claim 21 wherein said non-read state occurs when a write state machine is active.

31. The method for address transition detection as set forth in claim 30 wherein said write state machine is active when said memory array is being programmed or erased.

* * * * *